(12) United States Patent
Cheng et al.

(10) Patent No.: US 12,119,346 B2
(45) Date of Patent: Oct. 15, 2024

(54) VERTICAL FIELD-EFFECT TRANSISTOR WITH WRAP-AROUND CONTACT STRUCTURE

(71) Applicant: International Business Machines Corporation, Armonk, NY (US)

(72) Inventors: Kangguo Cheng, Schenectady, NY (US); Shogo Mochizuki, Mechanicville, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 463 days.

(21) Appl. No.: 17/480,717

(22) Filed: Sep. 21, 2021

(65) Prior Publication Data

US 2023/0099767 A1  Mar. 30, 2023

(51) Int. Cl.
  *H01L 27/08* (2006.01)
  *H01L 21/8234* (2006.01)
  *H01L 27/088* (2006.01)
  *H01L 29/08* (2006.01)
  *H01L 29/66* (2006.01)
  *H01L 29/78* (2006.01)

(52) U.S. Cl.
  CPC .. *H01L 27/0886* (2013.01); *H01L 21/823418* (2013.01); *H01L 21/823431* (2013.01); *H01L 21/823468* (2013.01); *H01L 29/0847* (2013.01); *H01L 29/6656* (2013.01); *H01L 29/66795* (2013.01); *H01L 29/7851* (2013.01)

(58) Field of Classification Search
  CPC ......... H01L 27/0886; H01L 21/823418; H01L 21/823431; H01L 21/823468; H01L 29/0847; H01L 29/6656; H01L 29/66795; H01L 29/7851; H01L 21/76843; H01L 21/76897; H01L 23/485; H01L 29/456; H01L 29/4966; H01L 29/517; H01L 29/41741; H01L 29/7827; H01L 29/66666
  See application file for complete search history.

(56) References Cited

U.S. PATENT DOCUMENTS

| | | | |
|---|---|---|---|
| 9,425,310 | B2 | 8/2016 | Yang |
| 9,735,253 | B1 | 8/2017 | Bi et al. |
| 10,084,094 | B1 | 9/2018 | Cheng et al. |
| 10,192,867 | B1 | 1/2019 | Frougier et al. |

(Continued)

*Primary Examiner* — Andres Munoz
*Assistant Examiner* — William C. Trice, III
(74) *Attorney, Agent, or Firm* — Samuel Waldbaum; Ryan, Mason & Lewis LLP

(57) ABSTRACT

A vertical field-effect transistor device includes a substrate comprising a semiconductor material, and a set of fins formed from the semiconductor material and extending vertically with respect to the substrate. The vertical field-effect transistor device further includes gate structures disposed on the substrate and on a portion of sidewalls of the set of fins, spacers disposed on the gate structures and on a remaining portion of the sidewalls of the set of fins, source/drain regions disposed over top portions of the set of fins, and a metal liner disposed adjacent and over the source/drain regions such that a wrap-around contact is defined to cover an upper area of the source/drain regions. A portion of the source/drain regions is configured to have a lateral width less than a width between adjacent gate structures on the respective fin.

20 Claims, 6 Drawing Sheets

(56) References Cited

U.S. PATENT DOCUMENTS

| | | |
|---|---|---|
| 10,483,361 B1 | 11/2019 | Lee et al. |
| 10,665,590 B2 | 5/2020 | Xie et al. |
| 10,923,590 B2 | 2/2021 | Cheng et al. |
| 2019/0172830 A1* | 6/2019 | Ok .................. H01L 21/823807 |
| 2019/0371920 A1* | 12/2019 | Xu .................... H01L 29/78684 |
| 2020/0111714 A1* | 4/2020 | Lee ....................... H01L 29/785 |

* cited by examiner

VERTICAL FIELD-EFFECT TRANSISTOR WITH WRAP-AROUND CONTACT STRUCTURE

BACKGROUND

This disclosure relates generally to semiconductor fabrication techniques and, in particular, to structures and methods for fabricating vertical field-effect transistor devices.

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field-effect transistors (VTFETs)) have become viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

SUMMARY

According to an exemplary embodiment, a vertical field-effect transistor device comprises a substrate which comprises a semiconductor material. The vertical field-effect transistor device further comprises a set of fins formed from the semiconductor material and extending vertically with respect to the substrate. The vertical field-effect transistor device further comprises gate structures disposed on the substrate and on a portion of sidewalls of the set of fins. The vertical field-effect transistor device further comprises spacers disposed on the gate structures and on a remaining portion of the sidewalls of the set of fins. The vertical field-effect transistor device further comprises source/drain regions disposed over top portions of the set of fins. A portion of the source/drain regions is configured to have a lateral width less than a width between adjacent gate structures on the respective fin. The vertical field-effect transistor device further comprises a metal liner disposed adjacent and over the source/drain regions such that a wrap-around contact is defined to cover an upper area of the source/drain regions.

According to an exemplary embodiment, an integrated circuit comprises a plurality of semiconductor devices, wherein at least one of the plurality of semiconductor devices comprises a vertical field-effect transistor device. The vertical field-effect transistor device comprises a substrate which comprises a semiconductor material. The vertical field-effect transistor device further comprises a set of fins formed from the semiconductor material and extending vertically with respect to the substrate. The vertical field-effect transistor device further comprises gate structures disposed on the substrate and on a portion of sidewalls of the set of fins. The vertical field-effect transistor device further comprises spacers disposed on the gate structures and on a remaining portion of the sidewalls of the set of fins. The vertical field-effect transistor device further comprises source/drain regions disposed over top portions of the set of fins. A portion of the source/drain regions is configured to have a lateral width less than a width between adjacent gate structures on the respective fin. The vertical field-effect transistor device further comprises a metal liner disposed adjacent and over the source/drain regions such that a wrap-around contact is defined to cover an upper area of the source/drain regions.

According to an exemplary embodiment, a method for fabricating a vertical field-effect transistor device comprises patterning a substrate comprising a semiconductor material. The method further comprises forming a set of fins comprising the semiconductor material and extending vertically with respect to the substrate. The method further comprises forming gate structures on the substrate and on a portion of sidewalls of the set of fins. The method further comprises forming spacers on the gate structures and on a remaining portion of the sidewalls of the set of fins. The method further comprises forming source/drain regions over top portions of the set of fins. A portion of the source/drain regions is configured to have a lateral width less than a width between adjacent gate structures on the respective fin. The method further comprises forming a metal liner adjacent and over the source/drain regions such that a wrap-around contact is defined to cover an upper area of the source/drain regions.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1:
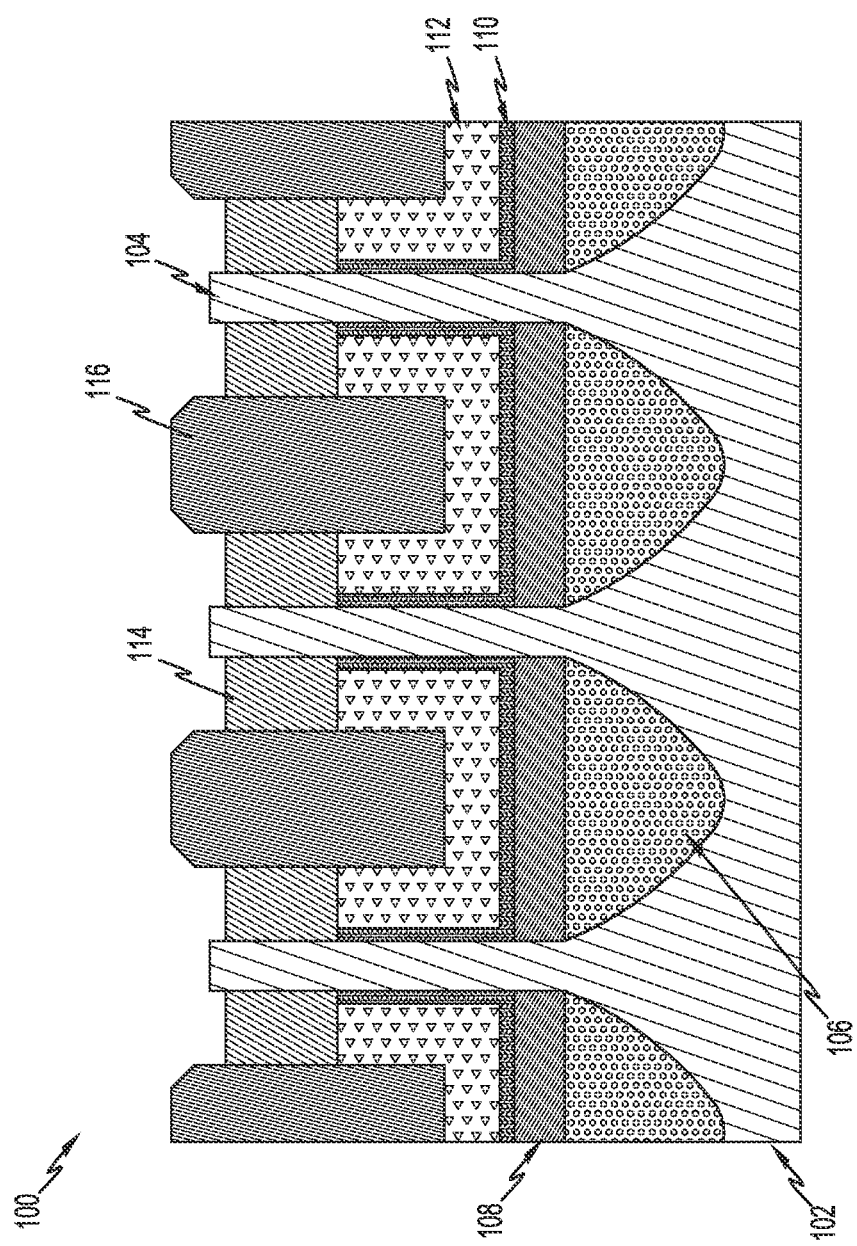
FIG. 1 is a cross-sectional view of a semiconductor structure at a first-intermediate fabrication stage, according to an illustrative embodiment.

This disclosure relates generally to transistors, and more particularly to vertical fin-shaped field effect transistors and methods for their fabrication. Exemplary embodiments will now be discussed in further detail with regard to semiconductor devices and methods of manufacturing same and, in particular, to forming a wrap-around-contact for top source/drain regions in VFET devices for improving the top contact to gate margin as well as reducing contact resistance.

VFETs are a promising option for technology scaling for 5 nm and beyond including fabricating complementary metal-oxide-semiconductor (CMOS) devices. However, process challenges for VFETs during the top source/drain contact (CA) formation include potential CA to metal gate shorts due to over etching of CA, source/drain epitaxial erosion during reactive ion etching of the CA resulting in a smaller size of the source/drain, and a higher contact resistance due to a smaller contact area. There is a need therefore to form a VFET without the above drawbacks.

Contact resistance is of a concern as transistor device scaling continues beyond the 5 nm technology node. The term contact resistance is the contribution to the total resistance of a material in which total resistance comes from the electrical leads and connections, as opposed to the intrinsic resistance that is an inherent property independent of the measurement method. Accordingly, illustrative non-limiting embodiments described herein correspond to VFETs with a top source/drain having a sacrificial layer formed thereon. The sacrificial layer advantageously serves as a placeholder to be removed during processing to form a wrap-around contact on the top source/drain to reduce contact resistance; and creates an overhang to prevent top contact to metal gate shorts thereby improving the process margin between the top contact to metal gate.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

The semiconductor devices and methods for forming same in accordance with embodiments described herein can be employed in applications, hardware, and/or electronic systems. Suitable hardware and systems for implementing illustrative embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of illustrative embodiments provided herein, one of ordinary skill in the art will be able to contemplate other implementations and applications of embodiments described herein.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1-6 illustrate various processes for fabricating VFETs for improving the top contact to gate margin as well as reducing contact resistance. Note that the same reference numeral (100) is used to denote the semiconductor structure through the various intermediate fabrication stages illustrated in FIGS. 1 through 6. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1-6 are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

FIG. 1 is a cross-sectional view of a semiconductor structure at the first-intermediate fabrication stage. Semiconductor structure 100 includes a substrate 102 and a set of fins 104. Although three vertical fins for the set of fins 104 are shown, the number of fins should not be considered limiting. Thus, a "set of fins" as used herein can be considered as including one or more fins. The fins 104 may be formed using, for example, an anisotropic etch such as reactive ion etching (RIE) that selectively removes material from the semiconductor substrate 102 in regions that are not protected by fin masks (not shown). It should be understood that the fin masks may be formed from any appropriate masking material, but silicon nitride is specifically contemplated. As used herein, the term "selective" in reference to a material removal process denotes that the rate of material removal for a first material is greater than the rate of removal for at least another material of the structure to which the material removal process is being applied.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. In another embodiment, the semiconductor substrate 102 may also be a semiconductor on insulator (SOI) substrate.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point in the present embodiment include ion beam etching, plasma etching or laser ablation. Alternatively, the fin structures 104 can be formed by spacer imaging transfer.

Semiconductor structure 100 further includes bottom source/drain regions 106 formed in substrate 102 between adjacent fins 104. One or more trenches are first formed in the substrate 102 between fins 104, by for example, a wet or dry etch process. Bottom source/drain regions 106 are then formed in the trenches by, for example, epitaxial growth processes. The epitaxially grown bottom source/drain regions 106 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (TI) at various concentrations. For example, in a non-limiting example, a dopant concentration range may be $1\times10^{18}/cm^3$ to $1\times10^{21}/cm^3$. According to an embodiment, the bottom source/drain region 106 can be boron doped SiGe for a p-type field-effect transistor (PFET) or phosphorous doped silicon for an n-type field-effect transistor (NFET). It is to be understood that the term "source/drain region" as used herein means that a given source/drain region can be either a source region or a drain region, depending on the application.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Semiconductor structure 100 further includes bottom spacer layer 108 formed on the bottom source/drain regions 106. Suitable material for bottom spacer layer 108 includes, for example, silicon boron nitride (SiBN), siliconborocarbonitride (SiBCN), silicon oxycarbonitride (SiOCN), SiN and $SiO_x$. Bottom spacer layer 108 can be deposited using, for example, directional deposition techniques, such as a high density plasma (HDP) deposition and gas cluster ion beam (GCIB) deposition. The directional deposition deposits the spacer material preferably on the exposed horizontal surfaces, but not on the lateral sidewalls. Alternatively, the spacer material can be deposited using, conformal deposition techniques, and removed from vertical surfaces using directional removal techniques, such as, for example, RIE. Any spacer material formed on the fins 104 can be removed using a planarization process, such as, for example, chemical mechanical planarization (CMP).

Semiconductor structure 100 further includes a metal gate stack, i.e., gate structures, formed on bottom spacer layer 108 and on a portion of fins 104. In illustrative embodiments, gate dielectric layer 110 and a work function metal layer 112 are deposited to form the gate structures. Gate dielectric layer 110 is deposited on bottom spacer layer 108 and on a portion of fins 104 employing, for example, chemical vapor deposition (CVD), plasma enhanced CVD (PECVD), radio-frequency CVD (RFCVD), physical vapor deposition (PVD), atomic layer deposition (ALD), or molecular layer deposition (MLD). The gate dielectric layer 110 includes, for example, a high-K material such as HfO$_2$ (hafnium oxide), ZrO$_2$ (zirconium dioxide), hafnium zirconium oxide Al$_2$O$_3$ (aluminum oxide), and Ta$_2$O$_5$ (tantalum pentoxide). It will be appreciated that "high-k" generally refers to a dielectric material having a dielectric constant (k) value greater than that of silicon oxide. For example, the high-k material has a dielectric constant greater than about 5, or greater than about 10.

Work function metal layer 112 is deposited on gate dielectric layer 110. The work function metal layer 112 includes one or more metals having a function suitable to tune the work function of NFETs or PFETs. For example, suitable work function metals include titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TIC) titanium aluminum carbide (TiAlC), tantalum carbide (TaC), hafnium carbide (HfC), and combinations thereof. It is appreciated that an NFET uses one type of work function metal and a PFET uses another type of work function metal. In one example, the work function metal layer 112 can be TIN for a PFET, and the work function metal layer 112 can be Al-doped TiN or TaN, etc., for an NFET. In some embodiments, a conductive material or a combination of multiple conductive materials can serve as both gate conductor and work function metal. The gate conductor and work function metal can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

Semiconductor structure 100 further includes a top spacer 114 formed on the work function metal layer 112 and on the remaining portion of the sidewalls of fins 104. The top spacer 114 includes, for example, silicon nitride (SIN), silicon boron nitride (SiBN), siliconborocarbonitride (SiBCN), or silicon oxycarbonitride (SiOCN). According to an embodiment, the top spacer 114 is conformally deposited using, for example, deposition techniques including, but not limited to, CVD, PECVD, RFCVD, PVD, ALD, MLD, MBD, PLD, LSMCD, sputtering, and/or plating. After deposition of top spacer 114, vias are formed between adjacent spacers 114 and the work function metal layer 112.

Semiconductor structure 100 further includes a dielectric fill layer 116 disposed in the vias and above a top surface of top spacer 114. The dielectric fill layer 116 includes, for example, oxides such as silicon dioxide, flowable oxide, spin-on-glass, etc. Dielectric fill layer 116 can be deposited using conventional deposition techniques such as CVD, followed by a planarization process, such as, for example, CMP. In some embodiments, a liner layer (not shown) is first deposited in the vias. The liner layer can be a nitride, such as, e.g., SiN or SiBCN.

Figure 2:
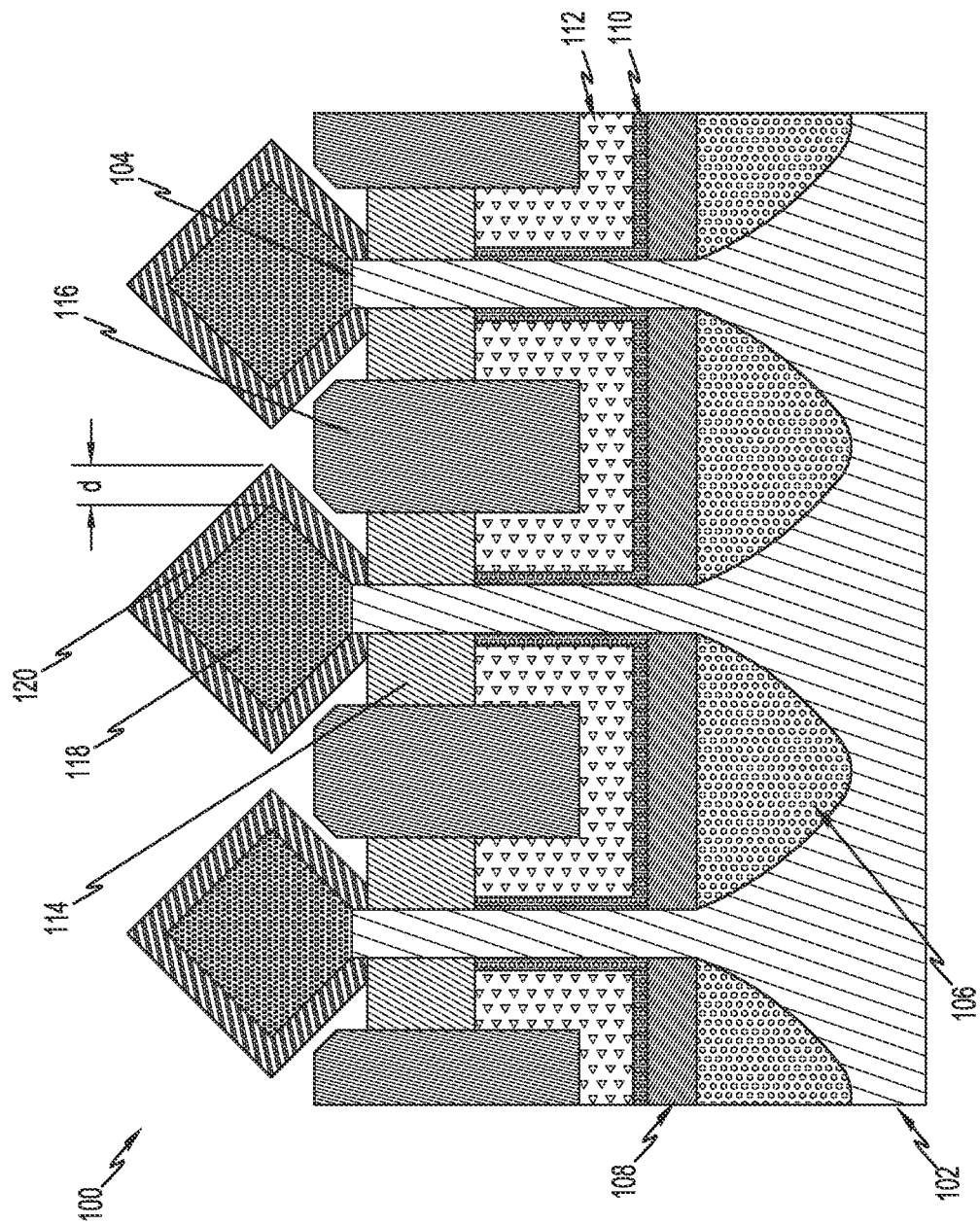
FIG. 2 is a cross-sectional view illustrating the semiconductor structure at a second-intermediate fabrication stage, according to an illustrative embodiment.

FIG. 2 illustrates semiconductor structure 100 at a second-intermediate fabrication stage. During this stage, a top source/drain region 118 followed by sacrificial layer 120 are formed. The top source/drain region 118 is epitaxially grown from the upper portions of the exposed fins 104 using epitaxial growth processes as described above. The epitaxially grown top source/drain region 118 can be formed in different epitaxial growth processes from each other and can be in-situ doped to be either a PFET, or NFET. When forming top source/drain regions 118, a portion of the source/drain regions is configured to have a lateral width less than a width, i.e., spacing, between adjacent gate structures on the respective fin. For example, in one embodiment top source/drain region 118 is formed in a diamond shaped configuration around the exposed upper portions of fins 104.

Next, a sacrificial layer 120 is epitaxially grown in an epitaxial growth process from top source/drain region 118. Suitable material for sacrificial layer 120 includes, for example germanium or silicon germanium. For example, in one embodiment, sacrificial layer 120 can be a silicon germanium layer having a relatively high content of germanium. In one embodiment, a silicon germanium layer includes Si in an amount of 20% to 40% and Ge in an amount of 80% to 60%. In one embodiment, a silicon germanium layer includes Si in an amount of 25% and Ge in an amount of 75%. Sacrificial layer 120 is formed of a suitable thickness to widen the lateral size of the entire source/drain region 118 by "d" on each side to prevent contact shorting to metal gate when conducting a contact trench etching step as discussed hereinbelow. In one illustrative embodiment, the thickness "d" of sacrificial layer 120 can range from about 3 nanometers (nm) to about 15 nm.

Figure 3:
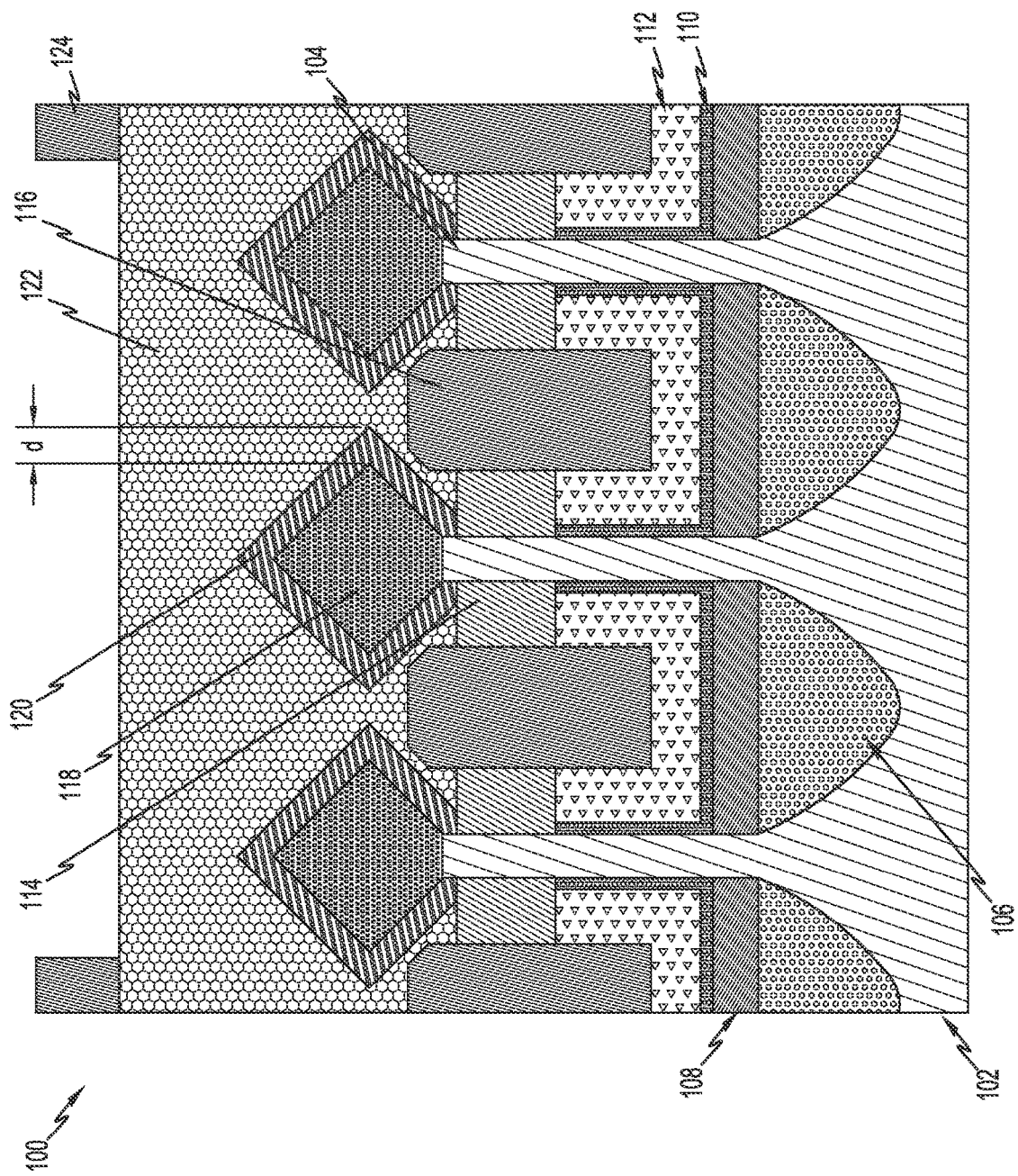
FIG. 3 is a cross-sectional view illustrating the semiconductor structure at a third-intermediate fabrication stage, according to an illustrative embodiment.

FIG. 3 illustrates semiconductor structure 100 at a third-intermediate fabrication stage. During this stage, an inter-level dielectric (ILD) layer 122 is deposited on semiconductor structure 100 and over top source/drain regions 118 and sacrificial layer 120. If desired, a first dielectric liner layer (not shown) such as, for example, a SiN layer, can be deposited on structure 100 prior to depositing ILD layer 122. The ILD layer 122 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. The ILD layer 122 may be formed using any suitable deposition techniques including CVD, ALD, PVD, PECVD, chemical solution deposition or other like processes. ILD layer 122 is then planarized by, for example, a planarization process such as CMP.

Next, hardmask 124 is deposited on ILD layer 122 for patterning a contact trench in ILD layer 122 to form a wrap-around contact. Since a wrap-around contact is being formed, the contact opening does not have to open the entire source/drain region. This also prevents contact tip-to-tip shorts and reduces parasitic capacitance. Hardmask 124 can be deposited by any conventional technique such as, for example, CVD, PVD. ALD, low-pressure CVD (LPCVD), PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), and metalorganic CVD (MOCVD). Suitable material for hardmask 124 includes, for example, Si$_3$N$_4$, SiBCN, SINC, SIN, SiCO, SiO$_2$, and SiNOC.

Figure 4:
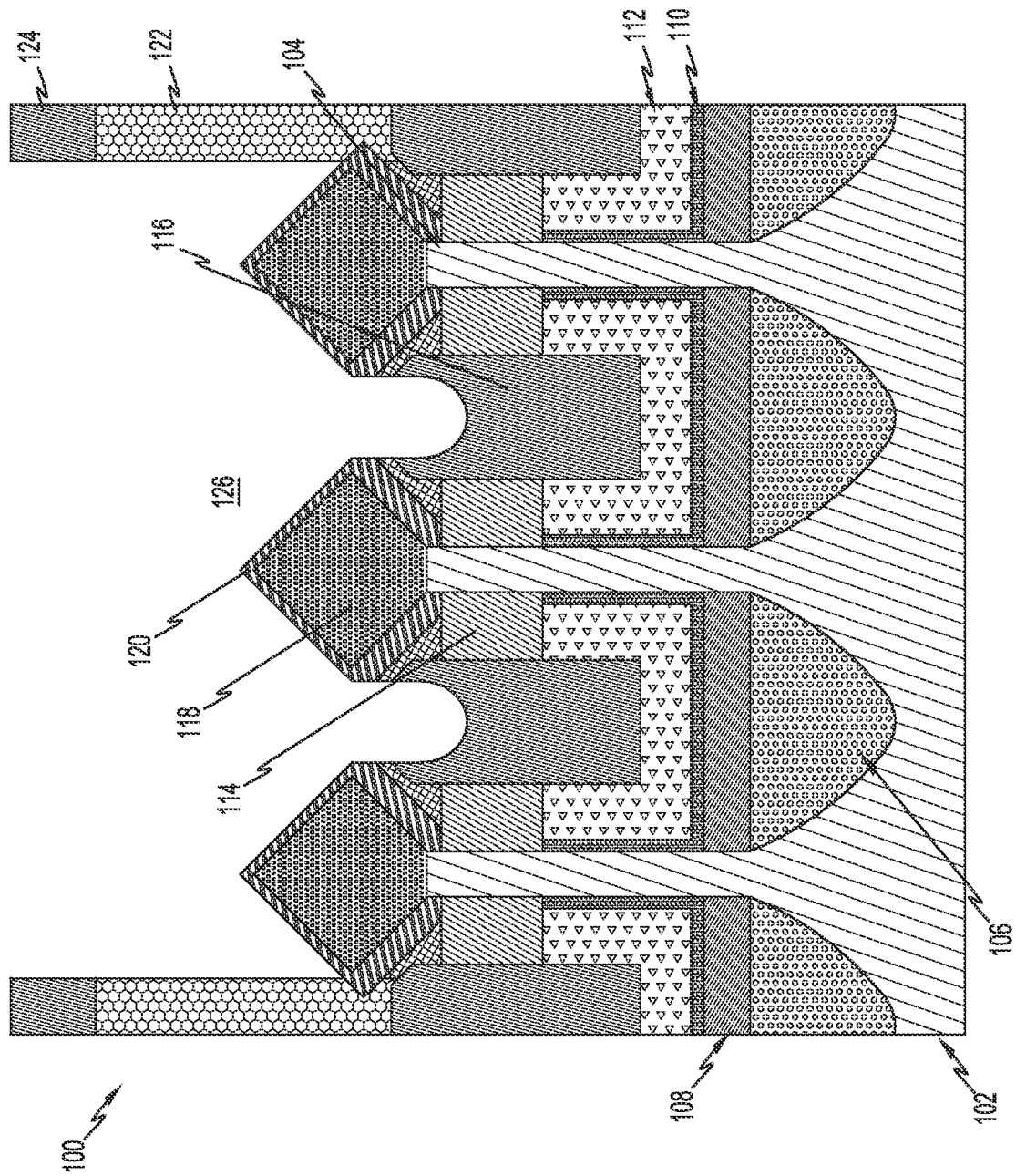
FIG. 4 is a cross-sectional view illustrating the semiconductor structure at a fourth-intermediate fabrication stage, according to an illustrative embodiment.

FIG. 4 illustrates semiconductor structure 100 at a fourth-intermediate fabrication stage. During this stage, contact trench 126 is formed in ILD layer 122 by an etching process utilizing the hardmask 124 applied to the ILD layer 122. Specifically, the exposed region of ILD layer 122 is removed using a selective etching process that removes the unprotected regions, e.g., a directional etch such as reactive ion etching (RIE). In the present fabrication stage, the etching is selective to remove the material of ILD layer 122 to sacrificial layer 120 on top source/drain region 118. As such, a respective portion of sacrificial layer 120 will be exposed within the contact trench 126, while other portions in the ILD layer 122 under hardmask 124 will not be exposed. However, it is to be understood that some portion of sacrificial layer 120 will be removed during the selective etching process. In addition, due to over-etching during the contact trench formation, a portion of dielectric fill layer 116 between top spacers 114 will be removed. The top source/drain region 118 is protected by the sacrificial layer 120 during over-etching.

Figure 5:
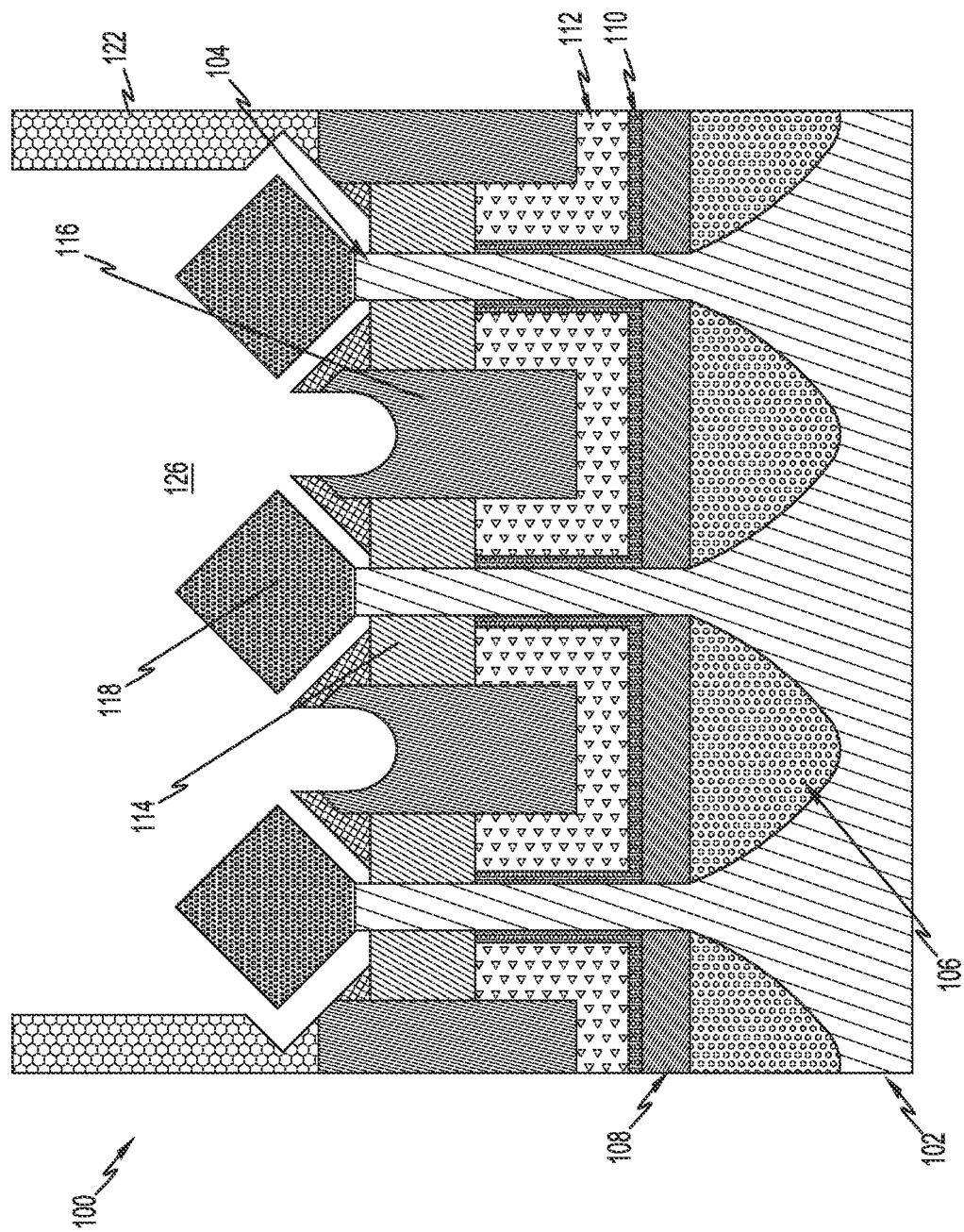
FIG. 5 is a cross-sectional view illustrating the semiconductor structure at a fifth-intermediate fabrication stage, according to an illustrative embodiment.

FIG. 5 illustrates semiconductor structure 100 at a fifth-intermediate fabrication stage. During this stage, sacrificial layer 120 is removed, for example, by a conventional selective removal process to expose top source/drain region 118. In some embodiments, the sacrificial layer 120 comprises SiGe and can be selectively removed by an isotropic etch process, for example, a vapor phase hydrochloric acid (HCl) dry etch, or a wet etch process containing a mix of ammonia and hydrogen peroxide.

Figure 6:
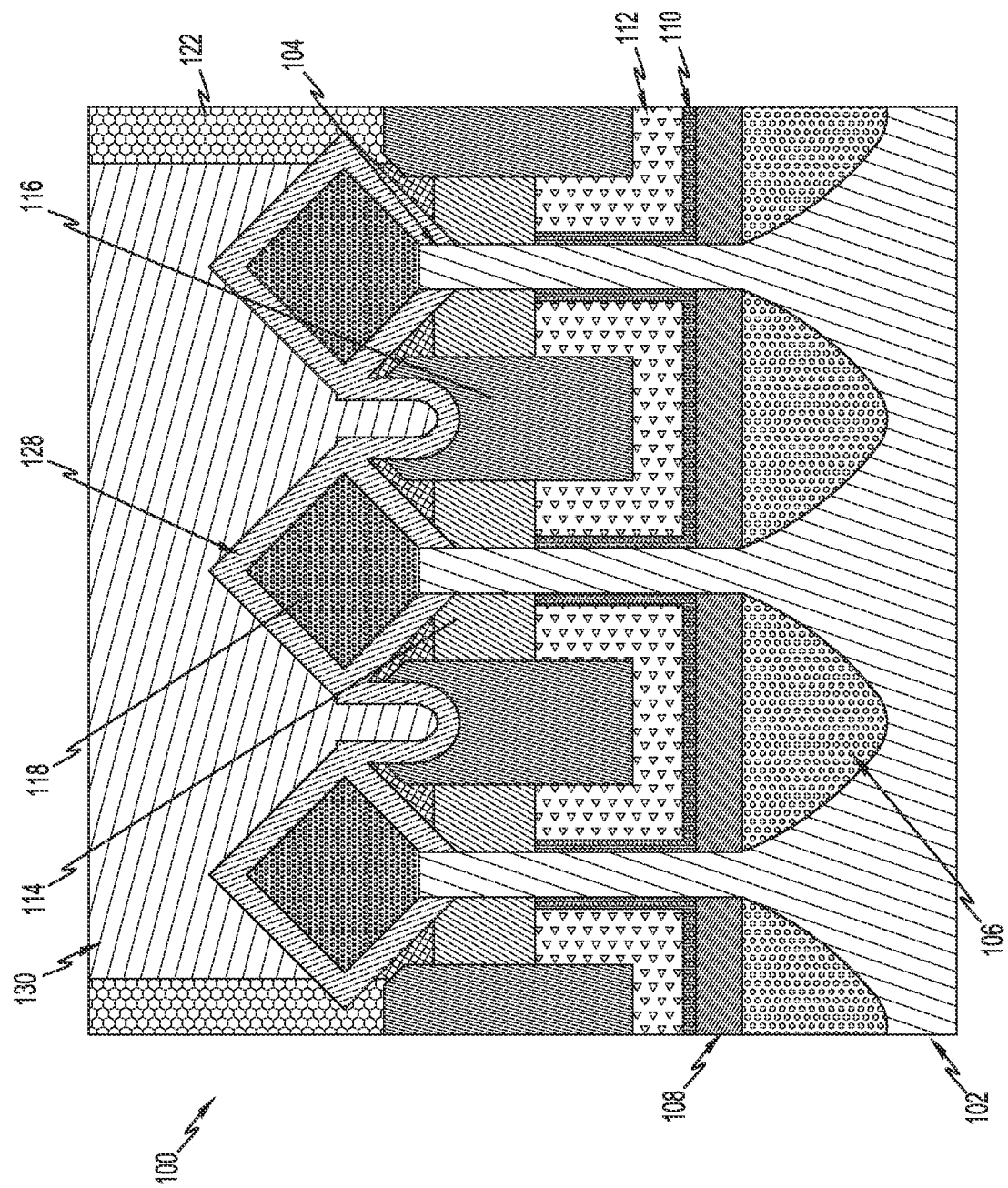
FIG. 6 is a cross-sectional view illustrating the semiconductor structure at a sixth-intermediate fabrication stage, according to an illustrative embodiment.

FIG. 6 illustrates semiconductor structure 100 at a sixth-intermediate fabrication stage. During this stage, metallization of the top/source drain region 118 takes place. The metallization includes depositing a metal liner 128 to encapsulate or wrap around the top source/drain region 118 forming a wrap-around contact to reduce contact resistance. In addition, metal liner 128 is also deposited in the over-etched portion of dielectric fill layer 116. In one exemplary embodiment, metal liner 128 can be, e.g., titanium/titanium nitride (Ti/TiN) layers or liners. In other exemplary embodiments, metal liner 128 can be formed from a suitable metal such as, for example, titanium nitride (TiN), tantalum nitride (TaN), hafnium nitride (HfN), niobium nitride (NbN), tungsten nitride (WN), tungsten carbon nitride (WCN), or combinations thereof. The metal liner 128 can be deposited by, e.g., an ALD, PVD, or CVD process.

Next, a metal fill 130 is deposited over conformal metal liner 128 and fills the rest of the contact trench. Suitable metals for metal fill 130 include conductive material such as, for example, tungsten (W), aluminum (Al), copper (Cu), cobalt (Co), nickel (Ni), titanium (Ti), ruthenium (Ru), molybdenum (Mo), or any other suitable conductive material. In various embodiments, a barrier layer can be deposited in the trench(es) by ALD, CVD, MOCVD, PECVD, or combinations thereof. In various embodiments, the metal fill can be formed by ALD, CVD, PVD, and/or plating. The metal fill 130 can be planarized. The planarizing process can include CMP. Other planarization processes can include grinding and polishing.

It is to be understood that the methods discussed herein for fabricating semiconductor structures (e.g., a VFET) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with non-limiting illustrative embodiments can be employed in applications, hardware, and/or electronic systems. Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A vertical field-effect transistor device, comprising:
a substrate comprising a semiconductor material;
a first fin and a second fin each formed from the semiconductor material and extending vertically with respect to the substrate;
gate structures disposed on the substrate and on a portion of sidewalls of the first fin and the second fin;
spacers disposed on the gate structures and on a remaining portion of the sidewalls of the first fin and the second fin;
a dielectric fill disposed between opposing sidewalls of the spacers and within the gate structures, wherein a top surface of outer ends of the dielectric fill is above a top-most surface of the spacers;
source/drain regions disposed over top portions of the first fin and the second fin; and
a metal liner disposed within the dielectric fill and adjacent and over the source/drain regions such that a wrap-around contact is defined to cover an upper area of the source/drain regions, wherein the wrap-around contact is isolated from the gate structures by the dielectric fill.

2. The vertical field-effect transistor device according to claim 1, wherein the semiconductor material is silicon.

3. The vertical field-effect transistor device according to claim 1, further comprising another source/drain region disposed in the substrate and adjacent the first fin and the second fin.

4. The vertical field-effect transistor device according to claim 1, further comprising a conductive material disposed over the metal liner directly above the source/drain regions disposed over the top portions of the first fin and the second fin.

5. The vertical field-effect transistor device according to claim 1, wherein the source/drain regions disposed over the top portions of the first fin and the second fin comprise a diamond shaped configuration.

6. The vertical field-effect transistor device according to claim 1, wherein the gate structures comprise a dielectric layer and a work function metal.

7. The vertical field-effect transistor device according to claim 1, wherein the first fin and the second fin extend above a top surface of the spacers.

8. The vertical field-effect transistor device according to claim 1, further comprising an interlevel dielectric layer disposed on opposite sides of the metal liner to define the upper area.

9. An integrated circuit, comprising:
a plurality of semiconductor devices, wherein at least one of the plurality of semiconductor devices comprises a vertical field-effect transistor device comprising:

a substrate comprising a semiconductor material;

a first fin and a second fin each formed from the semiconductor material and extending vertically with respect to the substrate;

gate structures disposed on the substrate and on a portion of sidewalls of the first fin and the second fin;

spacers disposed on the gate structures and on a remaining portion of the sidewalls of the first fin and the second fin;

a dielectric fill disposed between opposing sidewalls of the spacers and within the gate structures, wherein a top surface of outer ends of the dielectric fill is above a top-most surface of the spacers;

source/drain regions disposed over top portions of the first fin and the second fin; and a metal liner disposed within the dielectric fill and adjacent and over the source/drain regions such that a wrap-around contact is defined to cover an upper area of the source/drain regions, wherein the wrap-around contact is isolated from the gate structures by the dielectric fill.

10. The integrated circuit according to claim 9, wherein the semiconductor material is silicon.

11. The integrated circuit according to claim 9, further comprising another source/drain region disposed in the substrate and adjacent the first fin and the second fin.

12. The integrated circuit according to claim 9, further comprising a conductive material disposed over the metal liner directly above the source/drain regions disposed over the top portions of the first fin and the second fin.

13. The integrated circuit according to claim 9, wherein the source/drain regions disposed over the top portions of the first fin and the second fin comprise a diamond shaped configuration.

14. The integrated circuit according to claim 9, wherein the gate structures comprise a dielectric layer and a work function metal.

15. The integrated circuit according to claim 9, wherein the first fin and the second fin extend above a top surface of the spacers.

16. The integrated circuit according to claim 9, further comprising an interlevel dielectric layer disposed on opposite sides of the metal liner to define the upper area.

17. A method for fabricating a vertical field-effect transistor device, comprising:

patterning a substrate comprising a semiconductor material;

forming a first fin and a second fin each comprising the semiconductor material and extending vertically with respect to the substrate;

forming gate structures on the substrate and on a portion of sidewalls of the first fin and the second fin;

forming spacers on the gate structures and on a remaining portion of the sidewalls of the first fin and the second fin;

forming a dielectric fill between opposing sidewalls of the spacers and within the gate structures, wherein a top surface of outer ends of the dielectric fill is above a top-most surface of the spacers;

forming source/drain regions over top portions of the first fin and the second fin; and forming a metal liner within the dielectric fill and adjacent and over the source/drain regions such that a wrap-around contact is defined to cover an upper area of the source/drain regions, wherein the wrap-around contact is isolated from the gate structures by the dielectric fill.

18. The method according to claim 17, wherein the source/drain regions comprise a diamond shaped configuration.

19. The vertical field-effect transistor device according to claim 1, wherein the opposing sidewalls are vertical opposing sidewalls.

20. The integrated circuit according to claim 9, wherein the opposing sidewalls are vertical opposing sidewalls.

* * * * *